(12) United States Patent
Noh et al.

(10) Patent No.: US 10,497,335 B2
(45) Date of Patent: Dec. 3, 2019

(54) DISPLAY DEVICE

(71) Applicant: LG Display Co., Ltd., Seoul (KR)

(72) Inventors: Seok Noh, Chungcheongnam-do (KR); Injune Kim, Seoul (KR); Kimin Son, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 199 days.

(21) Appl. No.: 15/812,896

(22) Filed: Nov. 14, 2017

(65) Prior Publication Data

US 2018/0144711 A1 May 24, 2018

(30) Foreign Application Priority Data

Nov. 21, 2016 (KR) ........................ 10-2016-0155262

(51) Int. Cl.
*G11C 19/00* (2006.01)
*G09G 3/36* (2006.01)
(Continued)

(52) U.S. Cl.
CPC ......... *G09G 3/3696* (2013.01); *G09G 3/3266* (2013.01); *G09G 3/3677* (2013.01);
(Continued)

(58) Field of Classification Search
None
See application file for complete search history.

(56) References Cited

U.S. PATENT DOCUMENTS 4,754,165 A * 6/1988 Cornish ............... G11C 7/1051
327/212
5,998,935 A * 12/1999 Marcotte .............. G09G 3/2983
313/582

(Continued)

FOREIGN PATENT DOCUMENTS

EP 2 743 930 A1 6/2014

OTHER PUBLICATIONS

Extended European Search Report, dated Mar. 20, 2018 for the European patent application No. 17 20 1413.6.

*Primary Examiner* — Tuan T Lam
(74) *Attorney, Agent, or Firm* — Polsinelli PC

(57) ABSTRACT

A display device comprises: a pixel array including pixels connected to gate lines; a gate driver that sequentially supplies scan signals to the gate lines by using a plurality of stages connected in cascade; and a driving voltage generator that supplies first and second driving voltages to the gate driver and inverts the first and second driving voltages of opposite phases at given intervals, wherein an nth stage (n is a natural number), among the stages of the gate driver, comprises: a start controller that charges a Q1 node in a period when an (n−1)th scan signal and a first clock signal are synchronized, and charges a Q1B node in a period when an (n−1)th carry signal, opposite in phase to the (n−1)th scan signal, and the first clock signal are synchronized; a first node controller that charges a Q2 node or a Q2B node in response to a voltage at the Q1 node; a first output control transistor that outputs an nth scan signal through a Q node in response to a voltage at the Q2 node; and a second output control transistor that charges the Q node with the second driving voltage in response to a voltage at the Q2B node.

20 Claims, 7 Drawing Sheets

(51) Int. Cl.
*G09G 3/3266* (2016.01)
*G11C 19/28* (2006.01)

(52) U.S. Cl.
CPC ........... *G09G 2300/0426* (2013.01); *G09G 2300/0819* (2013.01); *G09G 2300/0871* (2013.01); *G09G 2310/0267* (2013.01); *G09G 2310/0286* (2013.01); *G09G 2310/08* (2013.01); *G09G 2320/0219* (2013.01); *G09G 2320/043* (2013.01); *G11C 19/28* (2013.01)

(56) References Cited

U.S. PATENT DOCUMENTS

| | | | | |
|---|---|---|---|---|
| 6,163,189 A | * | 12/2000 | Ogawa | H03K 3/356156 327/201 |
| 8,519,743 B2 | * | 8/2013 | Teh | H03K 3/356156 326/95 |
| 8,884,651 B2 | * | 11/2014 | Yamazaki | G09G 3/20 326/81 |
| 9,054,679 B2 | * | 6/2015 | Fujita | H03K 3/012 |
| 2004/0017237 A1 | * | 1/2004 | Wood | H03K 3/0375 327/210 |
| 2005/0156856 A1 | | 7/2005 | Jang et al. | |
| 2006/0290390 A1 | | 12/2006 | Jang et al. | |
| 2010/0245328 A1 | * | 9/2010 | Sasaki | G09G 3/3655 345/211 |
| 2011/0242079 A1 | * | 10/2011 | Yamamoto | G09G 3/3266 345/211 |
| 2011/0260764 A1 | * | 10/2011 | Kitahara | G06F 17/505 327/202 |
| 2014/0125392 A1 | * | 5/2014 | Javerliac | H03K 3/012 327/202 |
| 2015/0070255 A1 | * | 3/2015 | Lin | G09G 3/3266 345/77 |
| 2016/0284296 A1 | | 9/2016 | Dai | |

\* cited by examiner

DISPLAY DEVICE

CROSS-REFERENCE TO RELATED APPLICATION

This application claims the priority benefit of Korean Patent Application No. 10-2016-0155262 filed on Nov. 21, 2016, the entire contents of which is incorporated herein by reference for all purposes as if fully set forth herein.

BACKGROUND

Field of the Disclosure

The present disclosure relates to a display device.

Description of the Background

In a display device, data lines and gate lines are arranged to intersect at right angles, and pixels are arranged in a matrix form. Video data voltages to be displayed are applied to the data lines, and scan signals are sequentially supplied to the gate lines. The pixels on display lines to which the scan signals are supplied are supplied with the video data voltages, and video data is displayed as all the display lines are sequentially scanned by the scan signals.

In the display device, the gate driver which generates scan signals may be implemented in the form of a gate-in-panel (hereinafter, "GIP") constituted by a combination of thin-film transistors, on the bezel of the display panel where no image is displayed. The GIP-type gate driver has the number of stages corresponding to the number of gate lines, and the stages output scan signals to the gate lines on a one-to-one basis.

FIG. 1 is a schematic view showing an example of a stage of a shift register in a display device according to the related art.

Referring to FIG. 1, the stage comprises a pull-up transistor Tpu that outputs a scan signal Gouti corresponding to the timing of a clock signal in response to a Q node voltage, and a pull-down transistor Tpd that discharges a voltage at an output terminal Nout in response to a QB node voltage. A first transistor T1 pre-charges the Q node in response to a start pulse VST. A second transistor T2 discharges the Q node in response to a next stage signal VNEXT, and a third transistor T3 discharges the Q node in response to the QB node voltage. A node controller NCON is made up of a combination of transistors that can stably charge and discharge the Q node and the QB node.

While the Q node maintains a high-potential voltage during a period in which a scan signal Gouti is output and the QB node maintains the high-potential voltage during the other periods, the third transistor T3 and the pull-down transistor Tpd remain turned on. In one frame, the period in which the scan signal Gouti is output is very short, so the QB node maintains the high-level voltage during most of the one frame. As a result, the third transistor T3 and the pull-down transistor Tpd are subjected to DC stress for a long time compared to other transistors, thus causing changes in their characteristics. This makes the stage operation unstable.

SUMMARY

An exemplary aspect of the present disclosure provides a display device comprises: a pixel array including pixels connected to gate lines; a gate driver that sequentially supplies scan signals to the gate lines by using a plurality of stages connected in cascade; and a driving voltage generator that supplies first and second driving voltages to the gate driver and inverts the first and second driving voltages of opposite phases at given intervals, wherein an nth stage (n is a natural number) among the stages of the gate driver comprises: a start controller that charges a Q1 node in a period when an (n−1)th scan signal and a first clock signal are synchronized, and charges a Q1B node in a period when an (n−1)th carry signal, opposite in phase to the (n−1)th scan signal, and the first clock signal are synchronized; a first node controller that charges a Q2 node or a Q2B node in response to a voltage at the Q1 node; a first output control transistor that outputs an nth scan signal through a Q node in response to a voltage at the Q2 node; and a second output control transistor that charges the Q node with the second driving voltage in response to a voltage at the Q2B node.

Another aspect of the present disclosure provides a display device comprising a shift register including an nth stage controlling voltages of a Q1 node, a Q1B node, a Q2 node, a Q2B node and a Q node, where n is a natural number, wherein the nth stage comprises a start controller charging the Q1 node in a period when an (n−1)th scan signal and a first clock signal are synchronized, and charging the Q1B node in a period when an (n−1)th carry signal, opposite in phase to the (n−1)th scan signal, and the first clock signal are synchronized; a first node controller charging the Q2 node or the Q2B node in response to a voltage at the Q1 node; a first output control transistor outputting an nth scan signal through the Q node in response to a voltage at the Q2 node; and a second output control transistor charging the Q node with the second driving voltage in response to a voltage at the Q2B node.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
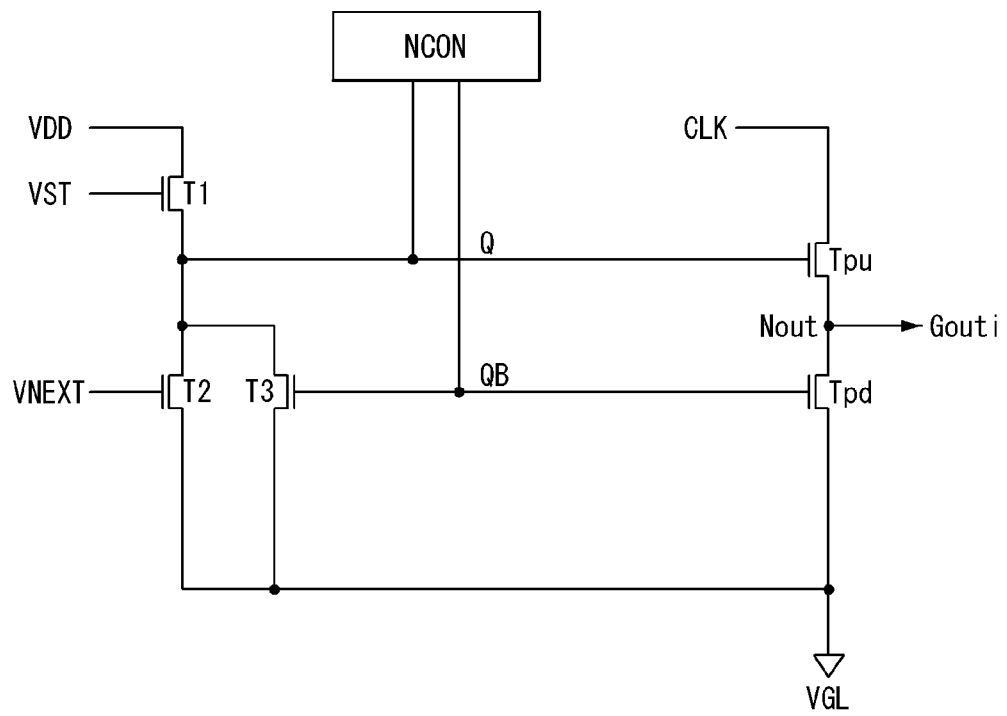
FIG. 1 is a schematic view showing an example of a stage of a shift register in a display device according to the related art.

Hereinafter, exemplary aspects of the present disclosure will be described in detail with respect to a liquid-crystal display device with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. The terms and names of elements used herein are chosen for ease of description and may differ from the names of actual products.

In a shift register of the present disclosure, switching elements may be implemented as n-type or p-type MOSFET (metal oxide semiconductor field effect transistor). It should be noted that, although the following exemplary aspect exemplifies n-type transistors, the present disclosure is not limited to them. A transistor is a three-electrode device with gate, source, and drain. The source is an electrode that provides carriers to the transistor. The carriers in the transistor flow from the source. The drain is an electrode where the carriers leave the transistor. That is, carriers in a MOSFET flow from the source to the drain. In the case of an n-type MOSFET (NMOS), the carriers are electrons, and thus the source voltage is lower than the drain voltage so that the electrons flow from the source to the drain. In the n-type MOSFET, since the electrons flow from the source to the drain, current flows from the drain to the source. In the case of a p-type MOSFET (PMOS), the carriers are holes, and thus the source voltage is higher than the drain voltage so that the holes flow from the source to the drain. In the p-type MOSFET, since the holes flow from the source to the drain, current flows from the source to the drain. It should be noted that the source and drain of a MOSFET are not fixed in position. For example, the source and drain of the MOSFET are interchangeable depending on the applied voltage. In the following exemplary aspect, the disclosure should not be limited by the source and drain of a transistor.

"Gate-on voltage", as used in this specification, refers to the operating voltage of a transistor. In this specification, an exemplary aspect is described with respect to an n-type transistor, and thus a gate-high voltage is defined as the gate-on voltage.

Figure 2:
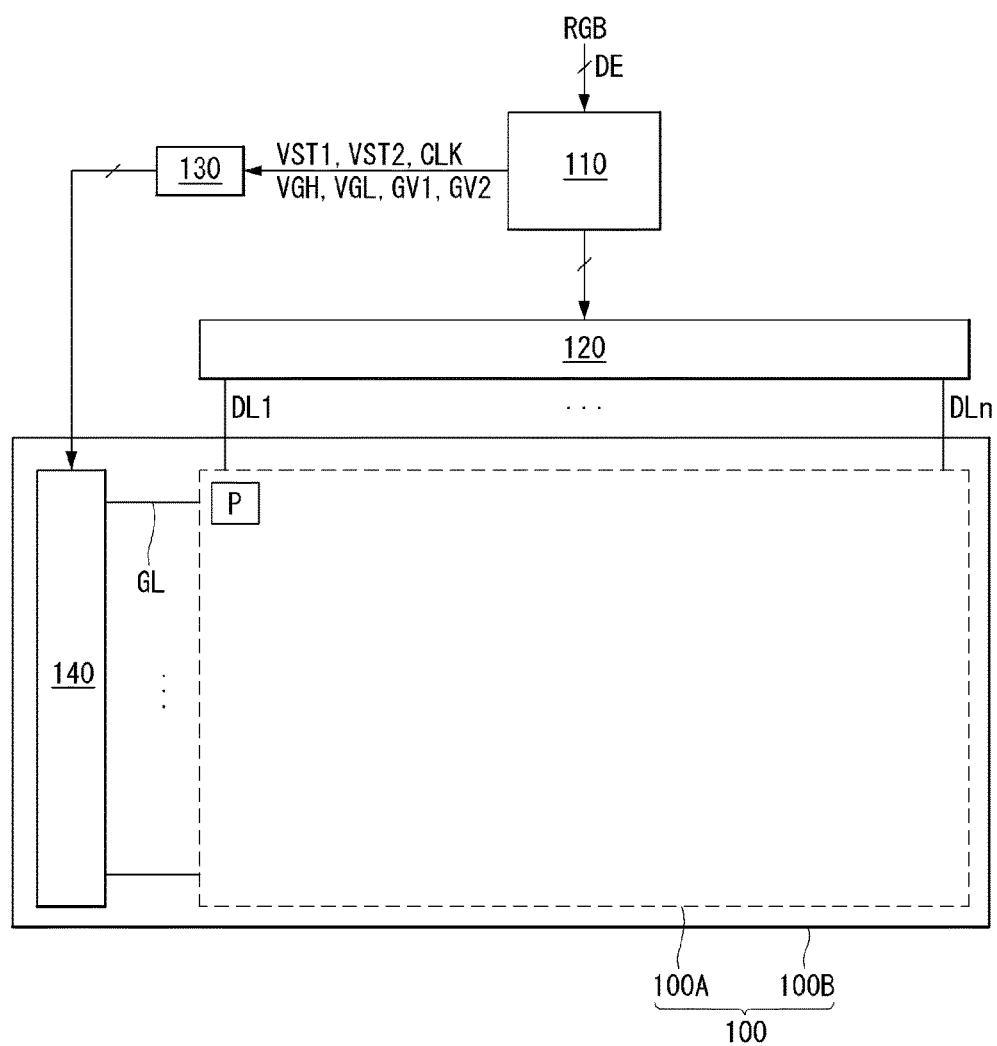
FIG. 2 is a schematic view showing a display device according to the present disclosure.

FIG. 2 is a schematic view showing a display device according to an exemplary aspect of the present disclosure.

Referring to FIG. 2, a display device of the present disclosure comprises a display panel 100, a timing controller 110, a data driver 120, and a gate driver 130 and 140.

The display panel 100 comprises a pixel array 100A where data lines DL and gate lines GL are defined and pixels are arranged, and a non-display area 100B around the pixel array 100A where various signal lines or pads are formed. For the display panel 100, a liquid crystal display (LCD), an organic light-emitting diode display (OLED), an electrophoresis display (EPD), etc. may be used.

The timing controller 110 receives timing signals, such as a vertical synchronization signal Vsync, a horizontal synchronization signal Hsync, a data enable signal DE, and a dot clock DCLK, through an LVDS or TMDS interface receiver circuit connected to a video board. On the basis of an input timing signal, the timing controller 110 generates data timing control signals DDC for controlling the operation timing of the data driver 120 and gate timing control signals GDC for controlling the operation timing of the gate driver 130 and 140. Also, the timing controller 110 generates first and second driving voltages GV1 and GV2 having voltage levels varied for a given period of time. The first and second driving voltages GV1 and GV2 may be generated by a separate driving voltage generator (not shown) besides the timing controller 110.

The data timing control signals comprise a source start pulse SSP, a source sampling clock SSC, a source output enable signal SOE, etc. The source start pulse SSP controls the shift start timing of the data driver 120. The source sampling clock SSC is a clock signal that controls the timing of data sampling in the data driver 120 with respect to the rising edge or falling edge.

The gate driver 130 and 140 respectively include a level shifter 130 and a shift register 140. The gate timing control signals comprise first and second start signals VST1 and VST2 and first and second clock signals CLK1 and CLK2. The first and second start signals VST1 and VST2 are input into a first stage STG(1) of the shift register 140 to control the shift start timing. The first and second clock signals CLK1 and CLK2 are level-shifted by the level shifter 130 and then input into the shift register 140.

The data driver 120 receives digital video data RGB and a data timing control signal DDC from the timing controller 110. The data driver 120 converts the digital video data RGB into gamma voltages in response to the data timing control signal DDC to produce data voltages and supply them through the data lines DL on the display panel 100.

The level shifter 130 is formed on a printed circuit board (not shown) that is connected to the display panel 100 in the form of IC. The level shifter 130 level-shifts the first and second start signals VST1 and VST2 and the first and second clock signals CLK1 and CLK2 and then supply them to the shift register 140. The shift register 140 comprises a plurality of stages connected in cascade.

Figure 3:
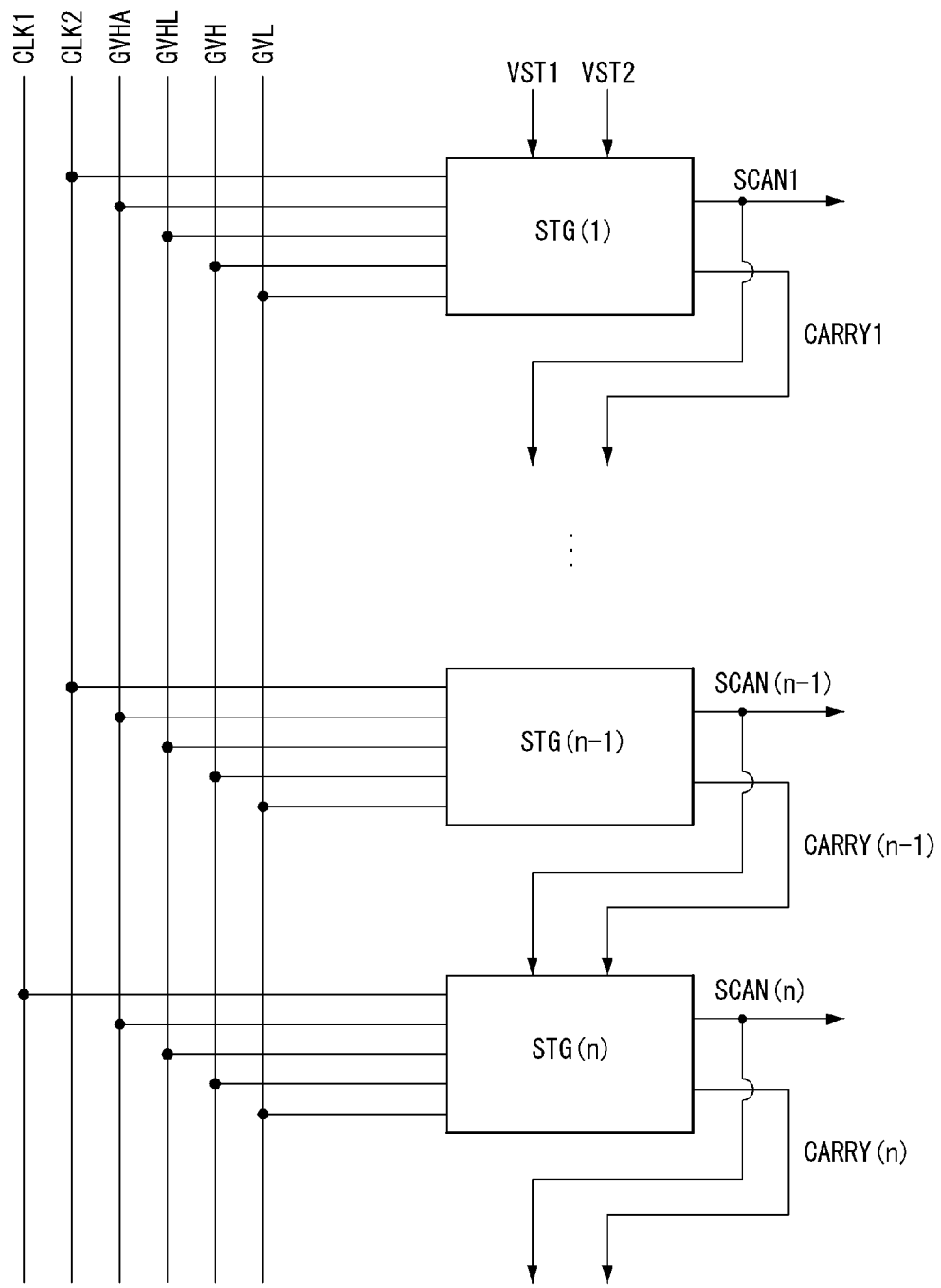
FIG. 3 is a schematic view showing a shift register according to the present disclosure.

FIG. 3 is a schematic view showing a shift register according to the present disclosure.

Referring to FIG. 3, the shift register 140 is formed by a combination of a plurality of thin-film transistors (hereinafter, "TFTs") in the non-display area 100B of the display panel 100, using the gate-in-panel (hereinafter, "GIP") technology, and sequentially outputs scan signals. To this end, the shift register 140 comprises a plurality of stages STG connected in cascade.

A first stage STG(1) receives first and second start signals VST1 and VST2 and outputs a first scan signal SCAN1 and a first carry signal CARRY1. An nth stage STG(n) receives an (n−1)th scan signal SCAN(n−1) and an (n−1)th carry signal CARRY(n−1) and outputs an nth scan signal SCAN(n) and an nth carry signal CARRY(n).

Each stage STG receives one of first and second clock signals CLK1 and CLK2 in order to determine the output timing and discharge timing of a scan signal SCAN. If the second clock signal CLK2 is input into an (n−1)th stage STG(n−1), the first clock signal CLK1 is input into the nth stage STG(n).

Each stage STG uses a gate-high voltage VGH and a gate-low voltage VGL as driving voltages. Also, each stage STG controls voltages at primary nodes by using a first driving voltage GV1 and a second driving voltage GV2.

Figure 4:
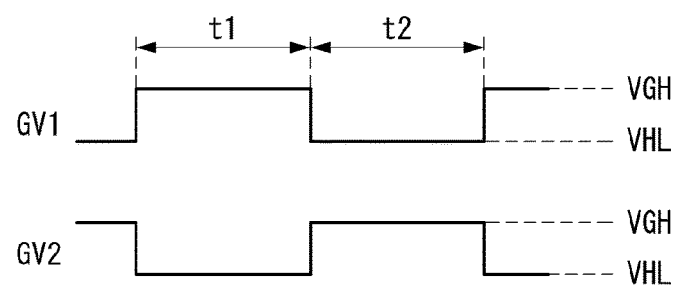
FIG. 4 is a schematic view showing the timings of first and second driving voltages.

FIG. 4 is a schematic view showing the timings of the first and second driving voltages GV1 and GV2 of FIG. 3.

Referring to FIG. 4, the first and second driving voltages GV1 and GV2 are opposite in phase and inverted at given intervals. The gate-high voltage VGH of the first and second driving voltages VG1 and VG2 is a gate-on voltage, and the gate-low voltage VGL thereof is a gate-off voltage.

First and second periods t1 and t2 in which the first and second driving voltage GV1 and GV2 are inverted and each period may be several seconds (s) or longer in length. The first and second periods t1 and t2 are periods for preventing concentration of DC stress on a particular transistor. Thus, the first and second periods t1 and t2 may be equally spaced and the length of time of each of these periods may be set according to various exemplary aspects. However, each stage operates differently depending on the voltage levels of the first and second driving voltages GV1 and GV2, and therefore the first and second driving voltages VG1 and GV2 remain at the same voltage level at least within one frame. Accordingly, the first and second periods t1 and t2 each are set to at least one frame or longer. One frame refers to a time period during which image data is written to all pixels on a pixel array.

Figure 5:
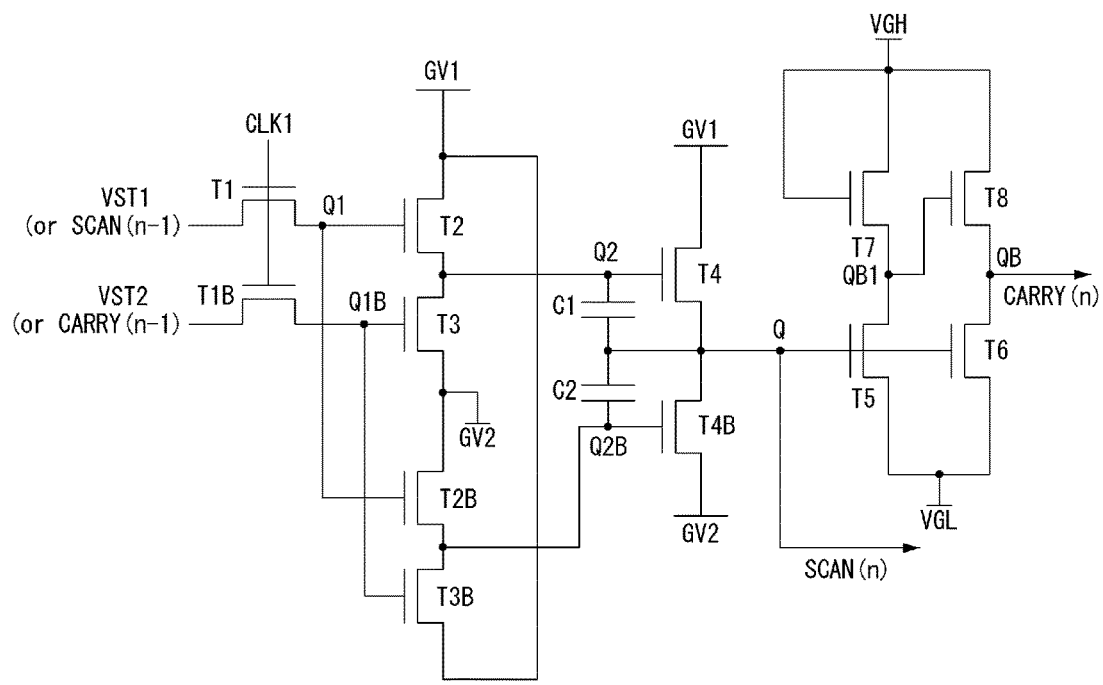
FIG. 5 is a schematic view showing an nth stage of the shift register.

FIG. 5 is a schematic view showing the nth stage of FIG. 3.

Referring to FIG. 5, the nth stage STG(n) according to the present disclosure comprises a start controller T1 and T1B, a first node controller T2 and T2B, a second node controller T3 and T3B, first and second output control transistors T4 and T4B, and an inverter T5, T6, T7, and T8.

The start controller T1 and T1B charges a Q1 node in a period when the (n−1)th scan signal SCAN(n−1) and the first clock signal CLK1 are synchronized, and charges a Q1B node in a period when the (n−1)th carry signal CARRY(n−1) and the first clock signal CLK1 are synchronized. The (n−1)th carry signal CARRY(n−1) is opposite in phase to the (n−1)th scan signal SCAN(n−1).

To this end, the start controller T1 and T1B comprises first and 1B transistors T1 and T1B.

The first transistor T1 comprises a drain electrode connected to an input terminal that supplies the (n−1)th scan signal SCAN(n−1), a source electrode connected to the Q1 node, and a gate electrode connected to an input terminal that supplies the first clock signal CLK1.

The 1B transistor T1B comprises a drain electrode connected to an input terminal that supplies the (n−1)th carry signal CARRY(n−1), a source electrode connected to the Q1B node, and a gate electrode connected to the input terminal that supplies the first clock signal CLK1.

The first node controller T2 and T2B charges a Q2 node in response to a voltage at the Q1 node or charges a Q2B node in response to a voltage at the Q1B node. To this end, the first node controller T2 and T2B comprises a second transistor T2 and a 2B transistor T2B.

The second transistor T2 comprises a gate electrode connected to the Q1 node, a drain electrode connected to an input terminal that supplies the first driving voltage GV1, and a source electrode connected to the Q2 node.

The 2B transistor T2B comprises a gate electrode connected to the Q1 node, a drain electrode connected to an input terminal that supplies the second driving voltage GV2, and a source electrode connected to the Q2B node.

The second node controller T3 and T3B charges the Q2B node in response to the voltage at the Q1B node. To this end, the second node controller T3 and T3B comprises a third transistor T3 and a 3B transistor T3B.

The third transistor T3 comprises a gate electrode connected to the Q1B node, a drain electrode connected to the input terminal that supplies the second driving voltage GV2, and a source electrode connected to the Q2 node.

The 3B transistor T3B comprises a gate electrode connected to the Q1B node, a drain electrode connected to the input terminal that supplies the first driving voltage GV1, and a source electrode connected to the Q2B node.

The first output control transistor T4 charges a Q node with the first driving voltage GV1 in response to a voltage at the Q2 node. The first output control transistor T4 comprises a gate electrode connected to the Q2 node, a drain electrode connected to the input terminal that supplies the first driving voltage GV1, and a source electrode connected to the Q node. Within the first period t1 when the first driving voltage GV1 is at the gate-high voltage VGH, the first output control transistor T4 outputs the nth scan signal SCAN(n) through the Q node in response to the Q2 node voltage. Alternatively, within the second period t2 when the first driving voltage GV1 is at the gate-low voltage VGL, the first output control transistor T4 discharges the Q node in response to the Q2 node voltage.

The second output control transistor T4B charges the Q node with the second driving voltage GV2 in response to a voltage at the Q2B node. The second output control transistor T4B comprises a gate electrode connected to the Q2B node, a drain electrode connected to the input terminal that supplies the second driving voltage GV2, and a source electrode connected to the Q node. Within the second period t2 when the second driving voltage GV2 is at the gate-high voltage VGH, the second output control transistor T4B outputs the nth scan signal SCAN(n) through the Q node in response to the Q2B node voltage. Alternatively, within the first period t1 when the second driving voltage GV2 is at the gate-low voltage VGL, the second output control transistor T4B discharges the Q node in response to the Q2B node voltage.

The inverter T5, T6, T7, and T8 is located between the Q node and the QB node, and outputs the nth carry signal CARRY(n) that is opposite in phase to a voltage at the Q node. To this end, the inverter T5, T6, T7, and T8 comprises fifth to eighth transistors T5, T6, T7, and T8.

The fifth transistor T5 comprises a gate electrode connected to the Q node, a drain electrode connected to a QB1 node, and a source electrode connected to an input terminal that supplies the gate-low voltage VGL.

The sixth transistor T6 comprises a gate electrode connected to the Q node, a drain electrode connected to the QB node, and a source electrode connected to the input terminal that supplies the gate-low voltage VGL.

The seventh transistor T7 comprises a gate electrode and drain electrode connected to an input terminal that supplies the gate-high voltage VGH, and a source electrode connected to the QB1 node.

The eighth transistor T8 comprises a gate electrode connected to the QB1 node, a drain electrode connected to the input terminal that supplies the gate-high voltage VGH, and a source electrode connected to the QB node.

Figure 6:
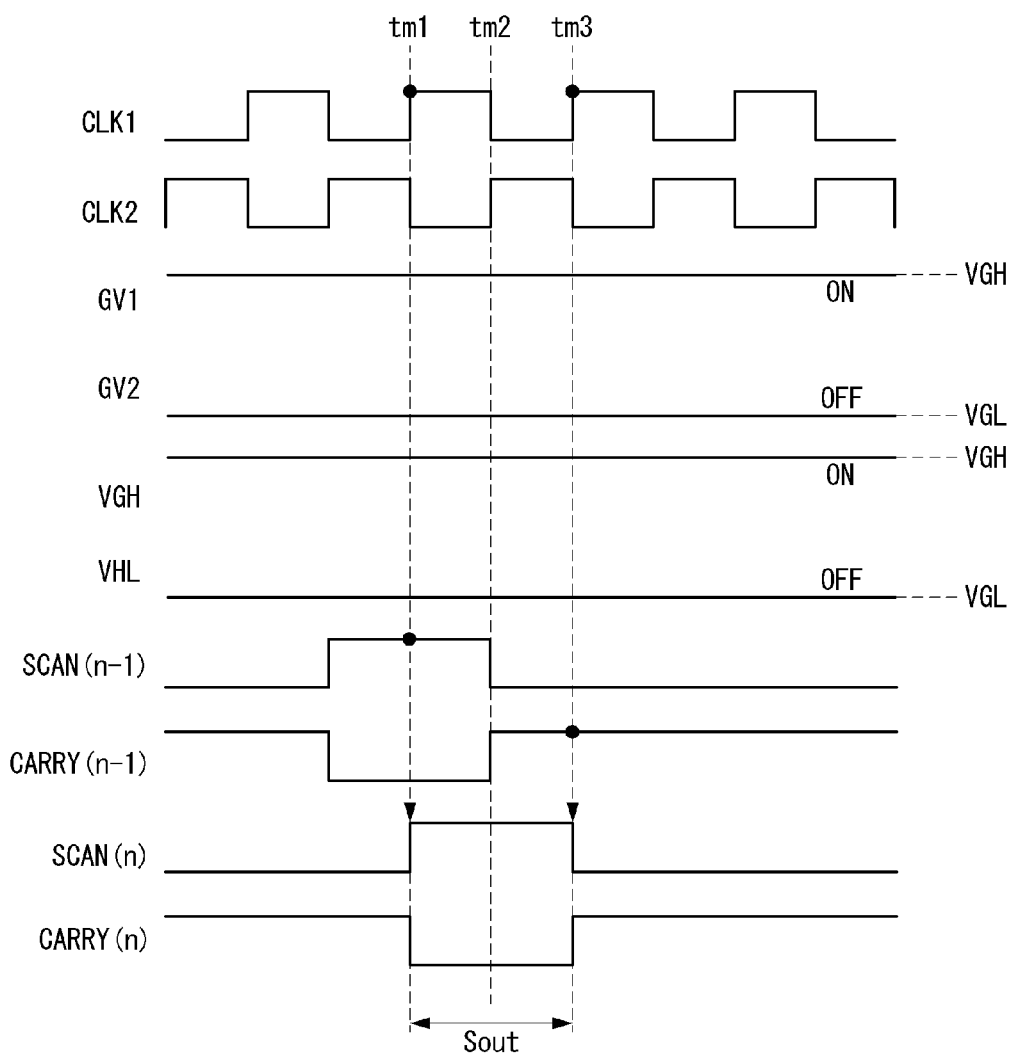
FIG. 6 is a timing diagram showing the shift register's driving signals and outputs in a first period shown in FIG. 4.

FIG. 6 is a timing diagram showing driving signals and output signals of the nth stage of FIG. 5. FIG. 6 is a timing diagram showing an operation of the nth stage in the first period of FIG. 4. That is, in FIG. 6, the first driving voltage GV1 is maintained at the gate-high voltage VGH (on-level ON), and the second driving voltage GV2 is maintained at the gate-low voltage VGL (off-level OFF).

Referring to FIGS. 4 to 6, an operation of the nth stage STG(n) will be described below.

At a first timing tm1, the (n−1)th scan signal SCAN(n−1) is maintained at the gate-high voltage VGH, and the first transistor T1 is turned on in response to the first clock signal CLK1. As a result, the Q1 node is charged with the gate-high voltage VGH.

The first node controller T2 and T2B is turned on in response to the voltage at the Q1 node, which is the gate-high voltage VGH. The second transistor T2 is turned on to pre-charge the Q2 node. The drain electrode of the first output control transistor T4 receives the first driving voltage GV1 whose voltage level is the gate-high voltage VGH, and therefore its voltage level rises. Consequently, the voltage level of the gate electrode of the first output control transistor T4 is bootstrapped. The gate-source voltage of the first output control transistor T4 reaches a threshold voltage at a time during the rise in the voltage level of the gate electrode of the first output control transistor T4, and as a result, the first output control transistor T4 is turned on to charge the Q node with the first driving voltage GV1. Since the voltage level of the first driving voltage GV1 is the gate-high voltage VGH during the first period t1, the Q node outputs the nth scan signal SCAN(n) whose voltage level is the gate-high voltage VGH.

The 2B transistor T2B is turned on in response to the voltage at the Q1 node to maintain the Q2B node at the gate-low voltage VGL. As a result, the second output control transistor T4B remains turned off.

When the voltage at the Q node is at the gate-high voltage VGH, the fifth transistor T5 and sixth transistor T6 of the inverter are turned on and the eighth transistor T8 thereof is turned off. As a result, the QB node is discharged to the gate-low voltage VGL.

At a second timing tm2, the first clock signal CLK1 is inverted to the gate-low voltage VGL, and the voltage at the Q1 node becomes the gate-low voltage VGL. As a result, the second transistor T2 is turned off. However, the Q2 node is coupled to the voltage at the Q node by a first capacitor C1 and maintains the gate-on voltage for a certain period of time. Consequently, the Q node maintains the gate-high voltage VGH from the second timing tm2 to a third timing tm3.

At the third timing tm3, the (n−1)th carry signal CARRY (n−1) is maintained at the gate-high voltage VGH, and the 1B transistor T1B is turned on in response to the first clock signal CLK1. As a result, the Q1B node is charged with the gate-high voltage VGH, and the second node controller T3 and T3B is turned on.

The third transistor T3 is turned on to charge the Q2 node with the second driving voltage GV2. Since the second driving voltage GV2 is at the gate-low voltage VGL during the first period t1, the voltage at the Q2 node becomes the gate-low voltage VGL at the third timing tm3. As a result, the first output control transistor T4 is turned off.

The 3B transistor T3B is turned on to charge the Q2B node with the gate-high voltage VGH. The second output control transistor T4B is turned on in response to the voltage at the Q2B node, which is the gate-high voltage VGH, to charge the Q node with the second driving voltage GV2. Since the second driving voltage GV2 is at the gate-low voltage VGL during the first period t1, the voltage at the Q node becomes the gate-low voltage VGL.

Figure 7:
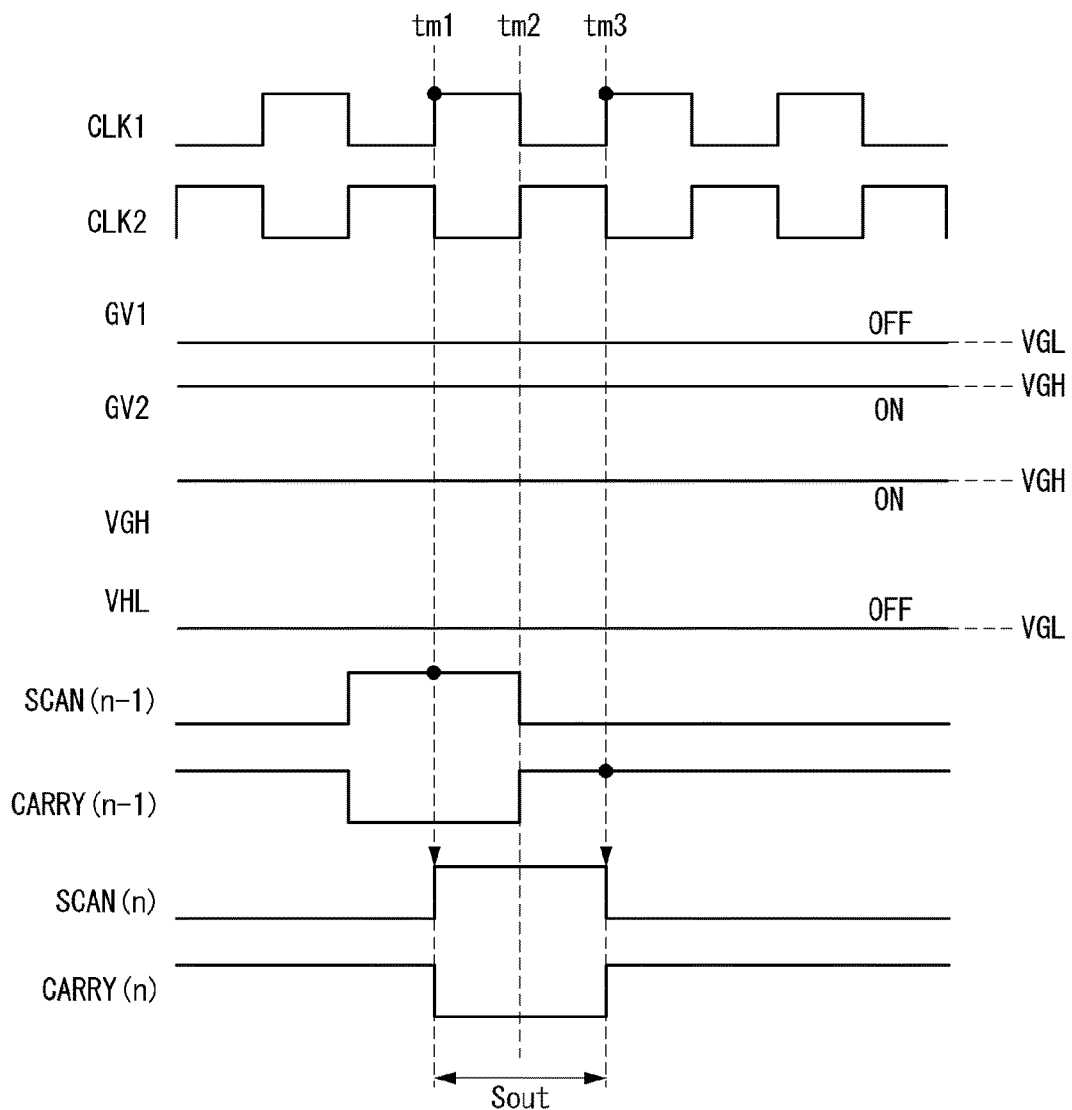
FIG. 7 is a timing diagram showing the shift register's driving signals and outputs in a second period shown in FIG. 4.

FIG. 7 is a timing diagram showing an operation of the nth stage in the second period of FIG. 4. That is, in FIG. 7, the second driving voltage GV2 is maintained at the gate-high voltage VGH (on-level ON), and the first driving voltage GV1 is maintained at the gate-low voltage VGL (off-level OFF).

Referring to FIGS. 4, 5, and 7, an operation of the nth stage STG(N) will be described below.

At a first timing tm1, the (n−1)th scan signal SCAN(n−1) is maintained at the gate-high voltage VGH, and the first transistor T1 is turned on in response to the first clock signal CLK1. As a result, the Q1 node is charged with the gate-high voltage VGH.

The first node controller T2 and T2B is turned on in response to the voltage at the Q1 node, which is the gate-high voltage VGH. The 2B transistor T2B is turned on to pre-charge the Q2B node. The drain electrode of the second output control transistor T4B receives the second driving voltage GV2 whose voltage level is the gate-high voltage VGH, and therefore its voltage level rises. Consequently, the voltage level of the gate electrode of the second output control transistor T4B is bootstrapped. The gate-source voltage of the second output control transistor T4B reaches a threshold voltage at a time during the rise in the voltage level of the gate electrode of the second output control transistor T4B, and as a result, the second output control transistor T4B is turned on to charge the Q node with the second driving voltage GV2. Since the voltage level of the second driving voltage GV2 is the gate-high voltage VGH, the Q node outputs the nth scan signal SCAN(n) whose voltage level is the gate-high voltage VGH.

The second transistor T2 is turned on in response to the voltage at the Q1 node to maintain the Q2 node at the gate-low voltage VGL. As a result, the first output control transistor T4 remains turned off.

When the voltage at the Q node is at the gate-high voltage VGH, the fifth transistor T5 and sixth transistor T6 of the inverter are turned on and the eighth transistor T8 thereof is turned off. As a result, the QB node is discharged to the gate-low voltage VGL.

At a second timing tm2, the first clock signal CLK1 is inverted to the gate-low voltage VGL, and the voltage at the Q1 node becomes the gate-low voltage VGL. As a result, the 2B transistor T2B is turned off. However, the Q2B node is coupled to the voltage at the Q node by a second capacitor C2 and maintains the gate-on voltage for a certain period of time. Consequently, the Q node maintains the gate-high voltage VGH from the second timing tm2 to a third timing tm3.

At the third timing tm3, the (n−1)th carry signal CARRY (n−1) is maintained at the gate-high voltage VGH, and the 1B transistor T1B is turned on in response to the first clock signal CLK1. As a result, the Q1B node is charged with the gate-high voltage VGH, and the second node controller T3 and T3B is turned on.

The 3B transistor T3B is turned on to charge the Q2B node with the first driving voltage GV1. Since the first driving voltage GV1 is at the gate-low voltage VGL during the second period t2, the voltage at the Q2B node becomes the gate-low voltage VGL at the third timing tm3. As a result, the second output control transistor T4B is turned off.

The third transistor T3 is turned on to charge the Q2 node with the second driving voltage GV2. Since the second driving voltage GV2 is at the gate-high voltage VGH during the second period t2, the voltage at the Q2 node becomes the gate-high voltage VGH. The first output control transistor T4 is turned on in response to the voltage at the Q2 node, which is the gate-high voltage VGH, to charge the Q node with the first driving voltage GV1. Since the first driving voltage GV1 is at the gate-low voltage VGL during the second period t2, the voltage at the Q node becomes the gate-low voltage VGL.

Figure 8:
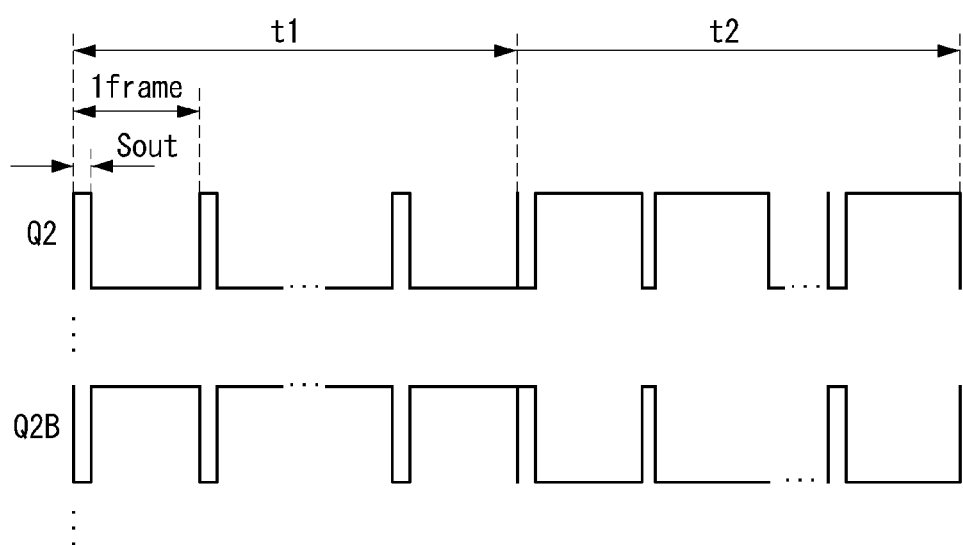
FIG. 8 is a timing diagram showing voltage changes at primary nodes of the nth stage.

FIG. 8 is a timing diagram showing voltage changes at primary nodes of the nth stage according to the present disclosure.

During an operation of the stage, the Q2 node and the Q2B node each are charged with the first driving voltage GV1 or the second driving voltage GV2. Since the first driving voltage GV1 and the second driving voltage GV2 are inverted at given intervals, the voltage level of the Q2 node and the voltage level of the Q2B node are inverted at given intervals.

For example, in the first period t1, the Q2 node maintains the gate-high voltage during an output time Sout, and the Q2B node maintains the gate-high voltage during the remaining time. In the second period t2, the Q2B node maintains the gate-high voltage during the output time Sout, and the Q2 node maintains the gate-high voltage during the remaining time.

The output time Sout when the nth scan signal SCAN(n) is output is very short compared to one frame. Accordingly, the second output control transistor T4B remains turned on for a long time within the first period t1, compared to the first output control transistor T4, and the first output control transistor T4 remains turned on for a long time within the second period t2 compared to the second output control transistor T4B.

As a consequence, the first output control transistor T4 and the second output control transistor T4B are turned on for a similar length of time, and the first and second output control transistors T4 and T4B are subjected to a similar level of electrical stress. Accordingly, it is possible to prevent a change in the threshold voltage of a particular transistor due to electrical stress and avoid the resulting instability of stage operation.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a pixel array including a plurality of pixels electrically connected to a plurality of gate lines;
a gate driver that sequentially supplies scan signals to the plurality of gate lines by using a plurality of stages connected in cascade; and
a driving voltage generator supplying first and second driving voltages to the gate driver and inverts the first and second driving voltages to have opposite phases with each other at given intervals,
wherein the plurality of stages of the gate driver includes an nth stage (n is a natural number), comprises:
a start controller charging a Q1 node in a period when an (n−1)th scan signal and a first clock signal are synchronized, and charging a Q1B node in a period when an (n−1)th carry signal, opposite in phase to the (n−1)th scan signal, and the first clock signal are synchronized;
a first node controller charging a Q2 node or a Q2B node in response to a voltage at the Q1 node;
a first output control transistor outputting an nth scan signal through a Q node in response to a voltage at the Q2 node; and
a second output control transistor charging the Q node with the second driving voltage in response to a voltage at the Q2B node.

2. The display device of claim 1, wherein the nth stage further comprises an inverter outputting an nth carry signal opposite in phase to the nth scan signal to a QB node, in response to a voltage at the Q node.

3. The display device of claim 1, wherein the nth stage further comprises a second node controller charging the Q2 node or the Q2B node in response to a voltage at the Q1B node.

4. The display device of claim 3, wherein the second node controller comprises:
a third transistor having a gate electrode connected to the Q1B node, a drain electrode connected to an input terminal supplying the second driving voltage, and a source electrode connected to the Q2 node; and
a 3B transistor having a gate electrode connected to the Q1B node, a drain electrode connected to an input terminal supplying the first driving voltage to the Q2B node, and a source electrode connected to the Q2B node.

5. The display device of claim 1, wherein the start controller comprises:
a first transistor having a drain electrode connected to an input terminal supplying the (n−1)th scan signal, a source electrode connected to the Q1 node, and a gate electrode connected to an input terminal supplying the first clock signal; and a 1B transistor having a drain electrode connected to an input terminal supplying the (n−1)th carry signal, a source electrode connected to the Q1B node, and a gate electrode connected to the input terminal supplying the first clock signal.

6. The display device of claim 1, wherein the first node controller comprises:
a second transistor having a gate electrode connected to the Q1 node, a drain electrode connected to an input terminal supplying the first driving voltage, and a source electrode connected to the Q2 node; and
a 2B transistor having a gate electrode connected to the Q1 node, a drain electrode connected to an input terminal supplying the second driving voltage, and a source electrode connected to the Q2B node.

7. The display device of claim 1, wherein the first output control transistor has a gate electrode connected to the Q2 node, a drain electrode connected to the input terminal supplying the first driving voltage, and a source electrode connected to the Q node.

8. The display device of claim 1, wherein the second output control transistor has a gate electrode connected to the Q2B node, a drain electrode connected to the input terminal supplying the second driving voltage, and a source electrode connected to the Q node.

9. The display device of claim 1, wherein the first clock signal alternates between a high level and a low level at equal intervals, and the start controller of an (n−1)th stage outputting the (n−1)th scan signal receiving a second clock signal that is opposite in phase to the first clock signal.

10. The display device of claim 1, wherein the first and second driving voltages have inverted voltage levels during a period longer than one frame interval.

11. The display device of claim 6, wherein the second transistor charges the Q2 node with the gate-high voltage of the first driving voltage, and the first output control transistor outputs the nth scan signal through the Q node when the first driving voltage is maintained at a gate-high voltage, the second driving voltage is maintained at a gate-low voltage, and the Q1 node is charged within a first period.

12. The display device of claim 11, wherein the 2B transistor charges the Q2B node with the gate-high voltage of the first driving voltage, and the second output control transistor discharges the Q node to the gate-low voltage of the second driving voltage when the Q1B node is charged within the first period.

13. The display device of claim 2, wherein the inverter comprises:
a fifth transistor having a gate electrode connected to the Q node, a drain electrode connected to a QB1 node, and a source electrode connected to an input terminal supplying a gate-low voltage;
a sixth transistor having a gate electrode connected to the Q node, a drain electrode connected to a QB node, and a source electrode connected to the input terminal supplying the gate-low voltage;

a seventh transistor having a gate electrode and drain electrode connected to an input terminal supplying a gate-high voltage, and a source electrode connected to the QB1 node; and an eighth transistor having a gate electrode connected to the QB1 node, a drain electrode connected to the input terminal supplying the gate-high voltage, and a source electrode connected to the QB node.

14. The display device of claim 1, wherein the nth stage further comprises:
a first capacitor connected between the Q2 node and the Q node; and
a second capacitor connected between the Q2B node and the Q node.

15. A display device, comprising:
a shift register including an nth stage controlling voltages of a Q1 node, a Q1B node, a Q2 node, a Q2B node, a Q node, and first and second driving voltages having opposite phase with each other at given intervals, where n is a natural number, wherein the nth stage comprises,
a start controller charging the Q1 node in a period when an (n−1)th scan signal and a first clock signal are synchronized, and charging the Q1B node in a period when an (n−1)th carry signal, opposite in phase to the (n−1)th scan signal, and the first clock signal are synchronized;
a first node controller charging the Q2 node or the Q2B node in response to a voltage at the Q1 node;

a first output control transistor outputting an nth scan signal through the Q node in response to a voltage at the Q2 node; and
a second output control transistor charging the Q node with the second driving voltage in response to a voltage at the Q2B node.

16. The display device of claim 15, wherein the nth stage further comprises an inverter outputting an nth carry signal opposite in phase to the nth scan signal to a QB node, in response to a voltage at the Q node.

17. The display device of claim 15, wherein the nth stage further comprises a second node controller charging the Q2 node or the Q2B node in response to a voltage at the Q1B node.

18. The display device of claim 15, wherein the nth stage further comprises a first capacitor connected between the Q2 node and the Q node, and a second capacitor connected between the Q2B node and the Q node.

19. The display device of claim 15, wherein the first clock signal alternates between a high level and a low level at equal intervals, and the start controller of an (n−1)th stage outputting the (n−1)th scan signal receiving a second clock signal that is opposite in phase to the first clock signal.

20. The display device of claim 15, wherein the first and second driving voltages have inverted voltage levels during a period longer than one frame interval.

* * * * *